United States Patent [19]

Baum

[11] Patent Number: 4,563,656

[45] Date of Patent: Jan. 7, 1986

[54] WIDEBAND TRANSIMPEDANCE OPTICAL RECEIVER

[75] Inventor: Peter N. Baum, Bedford, Mass.

[73] Assignee: GTE Laboratories Incorporated, Waltham, Mass.

[21] Appl. No.: 668,585

[22] Filed: Nov. 5, 1984

[51] Int. Cl.$^4$ ............................................. H03F 3/08
[52] U.S. Cl. .................................... 330/308; 330/59; 330/149; 330/300; 330/311
[58] Field of Search ................. 330/59, 149, 252, 277, 330/300, 308, 311

[56] References Cited

U.S. PATENT DOCUMENTS 3,573,491  4/1971  Goss et al. ...................... 330/300 X
3,611,173 10/1971  Goulding et al. ...................... 330/59
4,174,503 11/1979  Merklinger et al. ................. 330/300
4,420,724 12/1983  Owen ............................. 330/308 X

OTHER PUBLICATIONS

Tomasetta, L. R., "Integrated GaAs Optical Receiver" SPIE, vol. 272, High Speed Photodetectors, 1981, pp. 91-94.

Primary Examiner—Eugene R. LaRoche
Assistant Examiner—Steven J. Mottola
Attorney, Agent, or Firm—Fred Fisher

[57] ABSTRACT

A low noise optical receiver utilizes a novel amplifier as the open loop gain element. The amplifier provides for lower noise performance over that of commercial receivers, thus allowing longer fiber optic communication links.

3 Claims, 1 Drawing Figure

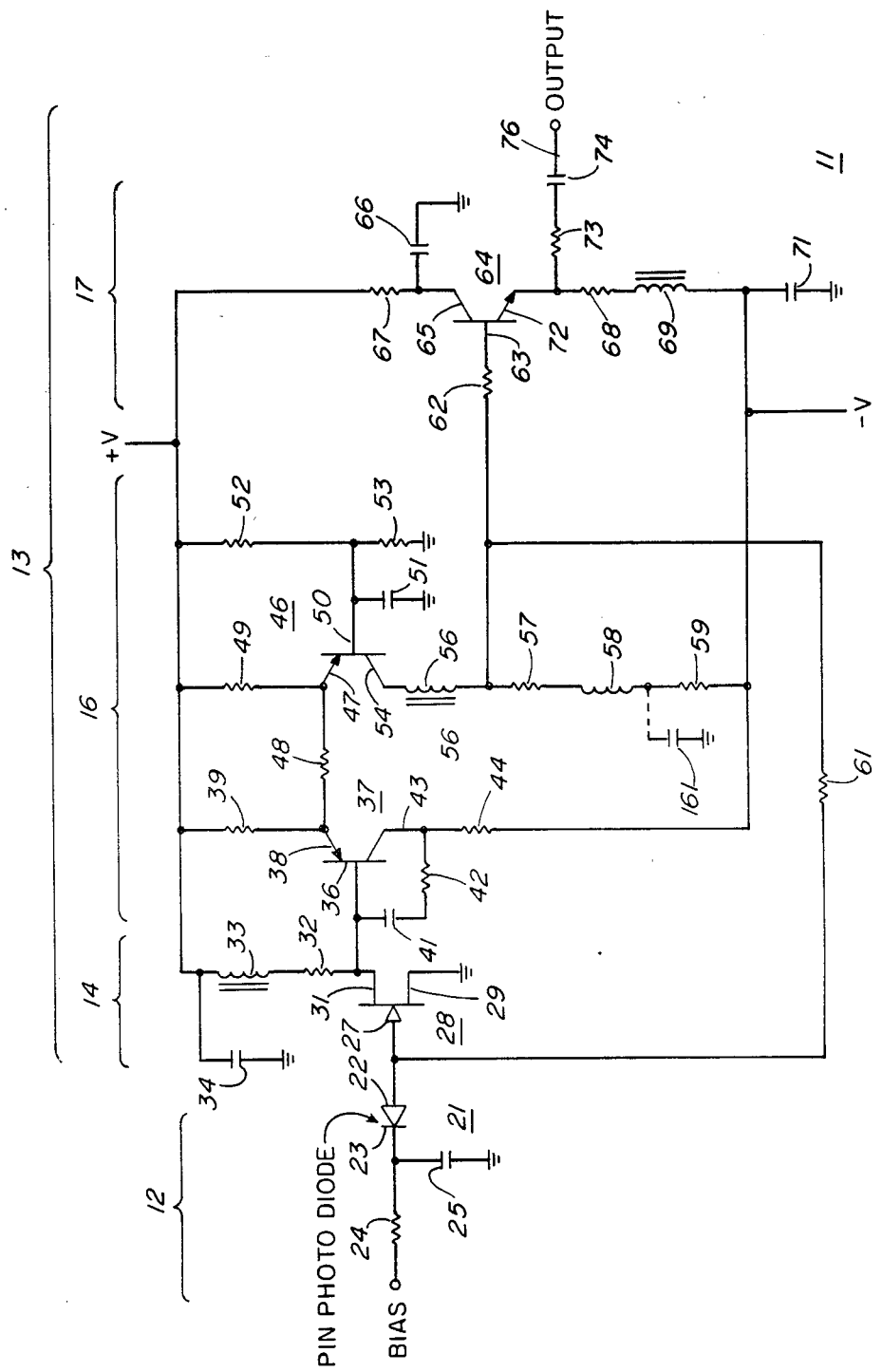

WIDEBAND TRANSIMPEDANCE OPTICAL RECEIVER

BACKGROUND OF THE INVENTION

1. Field of the Invention

This invention relates to wideband transimpedance optical receivers. Accordingly, it is a general object of this invention to provide new and improved receivers of such character.

2. General Background

Circuits that achieve transimpedance gain for use as optical receivers are commercially available that utilize bipolar transistors or FET/bipolar combinations. Though many operate below 100 MHz, they all operate with an open loop RC rolloff in the frequency band of use. A feedback resistor levels response of the amplifier in the same way as with operational amplifiers.

Generally, optical receivers experience two dominant phase shifting RC rolloff mechanisms that effect frequency response flatness and stability. One occurs at the optical detector where the shunt capacitance of the detector opposes the feedback resistor. The second is the dominant RC cut within the amplifier that determines the open loop rolloff with frequency. Reliance upon the feedback resistor to level the falling open loop response limits the maximum value thereof for a desired bandwidth. Disadvantageously, as the feedback resistor determines signal-to-noise ratio and bit error rate of the receiver, it should be made as large as possible to achieve the highest signal-to-noise ratio.

In view of the foregoing, it is desirable to provide an optical receiver that is designed to be flat at frequencies as high as 300 MHz, that makes use of a wideband amplifier to provide such flat response, and which does not rely on the transimpedance feedback resistor to level such response.

SUMMARY OF THE INVENTION

Another object of this invention is to provide a new and improved wideband transimpedance optical receiver having an improved signal-to-noise ratio over those receivers of the prior art.

Still another object of this invention is to provide a new and improved wideband transimpedance optical receiver utilizing a unilateral amplifier which provides a low noise, field effect transistor with a constant load impedance, making the field effect transistor gate-to-drain response flat with frequency.

Yet another object of this invention is to provide a new and improved wideband transimpedance optical receiver which enables changing the open loop gain by simply changing the amplifier collector load resistance.

In accordance with one aspect of the invention, a wideband transimpedance optical receiver includes an optical detector for providing an electrical signal in response to an optical signal. A field effect transistor has its gate electrode coupled to receive the electrical signal and has a source electrode adapted to be coupled to a point of reference potential. A first impedance means couples the drain electrode of the field effect transistor to a source of voltage of a first polarity. A unilateral amplifier is provided with a constant input impedance, and has an input coupled to the drain electrode of the field effect transistor. A feedback resistive means couples the output of the unilateral amplifier to the gate electrode of the field effect transistor. An emitter follower is coupled to receive the output of the unilateral amplifier, and to provide an isolated output therefrom.

In accordance with specific features of the invention, the first impedance means can include a serial inductance. A unilateral amplifier can include a first transistor, a first resistance for coupling the source of voltage of the first polarity to an emitter of the first transistor, and a serial capacitive-resistive circuit coupling the base of the first transistor to the collector thereof. A first collector resistor couples the first transistor collector to a source of voltage of a second polarity. The amplifier further includes a second transistor and a second resistance for coupling the source of voltage of the first polarity to an emitter of the second transistor. A resistor couples the emitters of the first and second transistors together. A voltage divider circuit, coupled across the source of the voltage of the first polarity and the point of reference potential, is applied as a direct current bias to the second transistor base. A capacitor couples the second transistor base to the point of reference potential. An impedance circuit couples the second transistor collector to the source of voltage to the second polarity.

In accordance with still other features of the invention, the second polarity can be a different polarity than that of the first polarity. The constant input impedance can be provided by the first transistor, the serial capacitive-resistive circuit, and the first collector resistor.

BRIEF DESCRIPTION OF THE DRAWINGS

Other objects, advantages and features of this invention, together with its construction and mode of operation, will become more apparent from the following description, when read in conjunction with the accompanying drawing, in which the sole figure is a circuit diagram of one embodiment of the invention.

GENERAL DESCRIPTION

Referring to the sole figure, which depicts a circuit of an optical receiver 11 in accordance with a preferred embodiment of the invention, there is shown an optical detector 12 which converts received optical signals into electrical signals which are amplified by a transimpedance amplifier 13.

The transimpedance amplifier 13 includes a field effect transistor front end circuit 14 coupled to a unilateral amplifier 16 that feeds an emitter follower 17.

The optical detector 12 includes a PIN photodiode 21 having an anode 22 and a cathode 23. The cathode 23 is provided with a bias via a resistance 24 and is coupled to ac ground by way of a capacitor 25. The anode 22 of the photodiode 21 is coupled to a gate electrode 27 of a field effect transistor (FET) 28 which is part of the FET front end 14. A source electrode 29 of the FET 28 is coupled to a point of reference potential, such as ground, whereas a drain electrode 31 of the FET 28 is coupled via a serially coupled resistor 32 and an RF choke 33 to a positive direct current potential source, such as +5 volts. The potential source of +5 volts is coupled via a separate capacitor 34 to ac ground.

The front end 14 of the FET 28 is coupled to the unilateral amplifier 16 via a coupling from the drain electrode 31 of the FET 28. The drain electrode 31 is coupled to a base 36 of a p-type transistor 37 having its emitter 38 coupled via a resistor 39 to the positive potential source of +5 volts. The base 36 of the transistor 37 is coupled by way of a serially coupled capacitor 41 and resistance 42 to the collector 43 of the transistor 37.

The collector 43 is also coupled by way of a resistance 44 to a negative potential source, such as −5 volts.

The p-type transistor 37 is coupled to another p-type transistor 46 in a common emitter relationship by having the emitter 38 of the transistor 37 and an emitter 47 of the transistor 46 coupled together by way of a resistor 48. The emitter 47 is further coupled via a resistance 49 to the positive potential source of +5 volts. A base 50 of the transistor 46 is coupled by way of a capacitor 51 to ac ground, and is directly coupled to a voltage dividing network 52, 53, formed of a pair of resistors coupled across the +5 volt potential source and a point of reference potential, such as ground.

The collector 54 of the p-type transistor 46 is serially coupled by an inductance 56, a resistor 57, another inductance 58, and a resistance 59 to the negative potential source of −5 volts. A capacitance 61 may be applied across the resistance 59 to establish ac reference to ground when necessary. The junction of the inductance 56 and the resistance 57 is coupled by a set of feedback resistances 61 to the gate 27 of the FET 28.

The connection of the inductance 56 and the resistance 57 can also be coupled via a transmitting resistance 62 to the base 63 of an n-type transistor 64. The collector 65 is coupled by a capacitor 66 to ac ground, and is provided with a resistor 67 to a positive potential source, such as +5 volts. An emitter 72 of the transistor 64 is coupled via a resistor 68 and radio frequency choke 69 to the negative potential source of +5 volts. A capacitor 71 is applied across the negative potential source and ac ground.

An output signal can be received from the emitter 72 of the transistor 64 via a serially connected resistance 73 and capacitor 74 to provide an output along a line 76 thereof.

In operation, the PIN photodiode 21, upon receiving an optical signal, drives the input of the transimpedance amplifier 13 by applying an electrical signal to the gate 27 of the FET 28. The FET 28 generates a signal current that is a function of the gate input voltage. The RF choke 33 inhibits current flow from being dissipated by the resistance 32 so that current is directed to flow into the input impedance of the unilateral amplifier 16 of the transistors 37, 46. The two transistors 37, 46 are coupled as a common emitter connected pair. The transistor 37, the capacitor 41 and the resistors 42, 44 provide a constant impedance to the output of the transistor 28, regardless of collector loading of the transistor 46.

Since the base 50 of the transistor 46 is coupled to ac ground by the capacitor 51, the output and input impedances of the two transistors 37, 46 are isolated and independent of each other, thereby causing the amplifier 16 to be unilateral. The emitter 47 of the transistor 46, effectively, is at ac ground.

Thus, the transistor 37, with the common resistance 48, the emitter resistance 39, the load resistance 44, and the feedback resistance 42, behaves as a wideband amplifier. The circuit provides a constant 50 ohm impedance to the FET 28, thus making the FET 28 gate-to-drain frequency response flat.

The signal current generated in the emitter 38 circuit of the transistor 37 flows through the transistor 46 to its collector 54. The load resistance 57 of the transistor 46 can be changed by using combinations of the resistances 57 and 59 (with and without the capacitance 161, as required) to establish the open loop gain. The inductance 56 tunes out the collector capacitance of the transistor 46. The inductors 56, 58 flatten the amplifier response for operation to 300 MHz. The feedback resistance 61 can be composed of several serially connected resistors to reduce their parallel capacitance. By design, the amplifier 13 is self-biasing. The emitter follower 64 isolates the collector 54 load of the transistor 46 from the undefined loads that the receiver 11 must drive. The resistor 73 provides a 50 ohm output impedance.

The unilateral wideband amplifier 16 provides a flat open loop response from the gate 27 of the FET 28 to the output 76 of the transistor 64. This removes restraints that the feedback resistor 61 must correct the amplifier 13 for flat response. This provides higher feedback resistors 61 to be used for a given bandwidth, thus providing improved signal-to-noise ratio and longer fiber optic links.

The transimpedance amplifier as described herein can be used with circuits other than optical detectors. For example, it can be used to amplify any signal current from about 1 MHz to 300 MHz, and it can be used for low noise performance.

What is claimed is:

1. A wideband transimpedance optical receiver comprising
   optical detection means for providing an electrical signal in response to an optical signal;
   a field effect transistor having a gate electrode coupled to receive said electrical signal, a source electrode adapted to be coupled to a point of reference potential, and a drain electrode;
   first impedance means for coupling said drain electrode to a source of voltage of a first polarity;
   unilateral amplifying means having a constant input impedance, an input coupled to said drain electrode, and an output;
   feedback resistive means coupling said output to said gate electrode; and
   an emitter follower coupled to receive said output from said unilateral amplifying means, and to provide an isolated output therefrom, wherein said unilateral amplifying means comprises
   a first transistor having an emitter, a collector, and a base electrode;
   a first resistance for coupling said source of said voltage of said first polarity to said first transistor emitter;
   a serial capacitive-resistive circuit coupling said base of said first transistor to said collector of said first transistor;
   a first collector resistor for coupling said first transistor collector to a source of voltage of a second polarity;
   a second transistor having an emitter, a collector, and a base electrode;
   a second resistance for coupling said source of said voltage of said first polarity to said second transistor emitter;
   a common emitter resistor for coupling said emitters of said first transistor and said second transistor together;
   a voltage divider circuit for coupling across said source of voltage of said first polarity and said point of reference potential, and for applying a direct current bias to said base of said second transistor;
   a capacitor for coupling said second transistor base to said point of reference potential; and an impedance circuit for coupling said second transistor collector to said source of voltage of said second polarity.

2. The receiver as recited in claim 1 wherein said second polarity is of a different polarity than that of said first polarity.

3. The receiver as recited in claim 1 wherein said constant input impedance is provided by said first transistor, said serial capacitive-resistive circuit, and said first collector resistor.

* * * * *